(12) United States Patent
Anastasov et al.

(10) Patent No.: US 8,976,051 B2
(45) Date of Patent: Mar. 10, 2015

(54) FLOATING POINT TIMER TECHNIQUES

(75) Inventors: Ljudmil Anastasov, Munich (DE); Jens Barrenscheen, Munich (DE)

(73) Assignee: Infineon Technologies AG, Neubiberg (DE)

(*) Notice: Subject to any disclaimer, the term of this patent is extended or adjusted under 35 U.S.C. 154(b) by 350 days.

(21) Appl. No.: 13/488,668

(22) Filed: Jun. 5, 2012

(65) Prior Publication Data

US 2012/0242381 A1    Sep. 27, 2012

Related U.S. Application Data

(62) Division of application No. 12/814,759, filed on Jun. 14, 2010, now Pat. No. 8,212,704.

(51) Int. Cl.
*H03M 1/82* (2006.01)
*G06F 1/06* (2006.01)
*H03M 7/24* (2006.01)
*H03K 7/08* (2006.01)

(52) U.S. Cl.
CPC . *G06F 1/06* (2013.01); *H03M 7/24* (2013.01); *H03K 7/08* (2013.01)
USPC ........... 341/152; 341/150; 341/154; 341/156; 341/158; 375/373; 375/354; 375/376; 382/312; 382/321; 368/113; 368/120; 327/100; 327/145; 327/162; 327/156; 327/277

(58) Field of Classification Search
CPC ........ H03K 3/0315; H03K 7/08; G04F 10/04; G06F 1/06; H03M 7/24
USPC ......... 327/100, 145, 162, 156, 277, 295, 299; 375/373, 354, 376; 382/312, 321; 368/113, 120; 341/135–155
See application file for complete search history.

(56) References Cited

U.S. PATENT DOCUMENTS

| | | | |
|---|---|---|---|
| 5,222,111 A | 6/1993 | Muramatsu | |
| 5,621,431 A * | 4/1997 | Harper et al. | 345/473 |
| 5,903,521 A | 5/1999 | Relph | |
| 6,009,215 A | 12/1999 | Yamada | |
| 7,881,413 B2 | 2/2011 | Nichols | |
| 8,125,286 B2 * | 2/2012 | Huang et al. | 331/179 |
| 8,212,704 B2 * | 7/2012 | Anastasov et al. | 341/152 |

OTHER PUBLICATIONS

Notice of Allowance dated Mar. 14, 2012 for U.S. Appl. No. 12/814,759. 29 Pages.

* cited by examiner

*Primary Examiner* — Lam T Mai
(74) *Attorney, Agent, or Firm* — Eschweiler & Associates, LLC

(57) ABSTRACT

Aspects of the present disclosure relate to floating point timers and counters that are used in a variety of contexts. In some implementations, a floating point counter can be used to generate a wave form made up of a series of pulses with different pulse lengths. An array of these floating point counters can be used to implement a pool of delays. In other implementations, an array of floating point counters can be used to analyze waveforms on a number of different communication channels. Analysis of such waveforms may be useful in automotive applications, such as in wheel speed measurement for example, as well as other applications.

10 Claims, 8 Drawing Sheets

FLOATING POINT TIMER TECHNIQUES

REFERENCE TO RELATED APPLICATION

This application is a Divisional of U.S. patent application Ser. No. 12/814,759 filed on Jun. 14, 2010.

BACKGROUND

Numbers can be represented in a variety of formats. For example, a fixed point number can be expressed in scientific notation in the format $mb^e$, where m represents a mantissa, b represents a base, and e represents an exponent. The mantissa portion of the number relates to precision of the number (e.g., the number of decimal places included in the number), and the exponent portion of the number relates to the range of the number (e.g., a power of ten). For example, the number 5,280 can be represented in scientific notation for base 10 as $5.280 \times 10^3$, where 5.280 is the mantissa (having four digits of precision) and 3 is the exponent.

Although fixed point counters are sometimes implemented in hardware, in instances where a very large number of count values are needed fixed point counters become somewhat unwieldy in that they require a large amount of data storage to keep track the large number of count values. Consequently, floating point counters have been developed. Floating point numbers automatically adjust their level of precision as a function of the size of the number.

As will be appreciated in more detail herein, the inventors have developed improved methods and devices related to floating point counters which are advantageous in a variety of contexts.

DETAILED DESCRIPTION

Figures 1, 2:
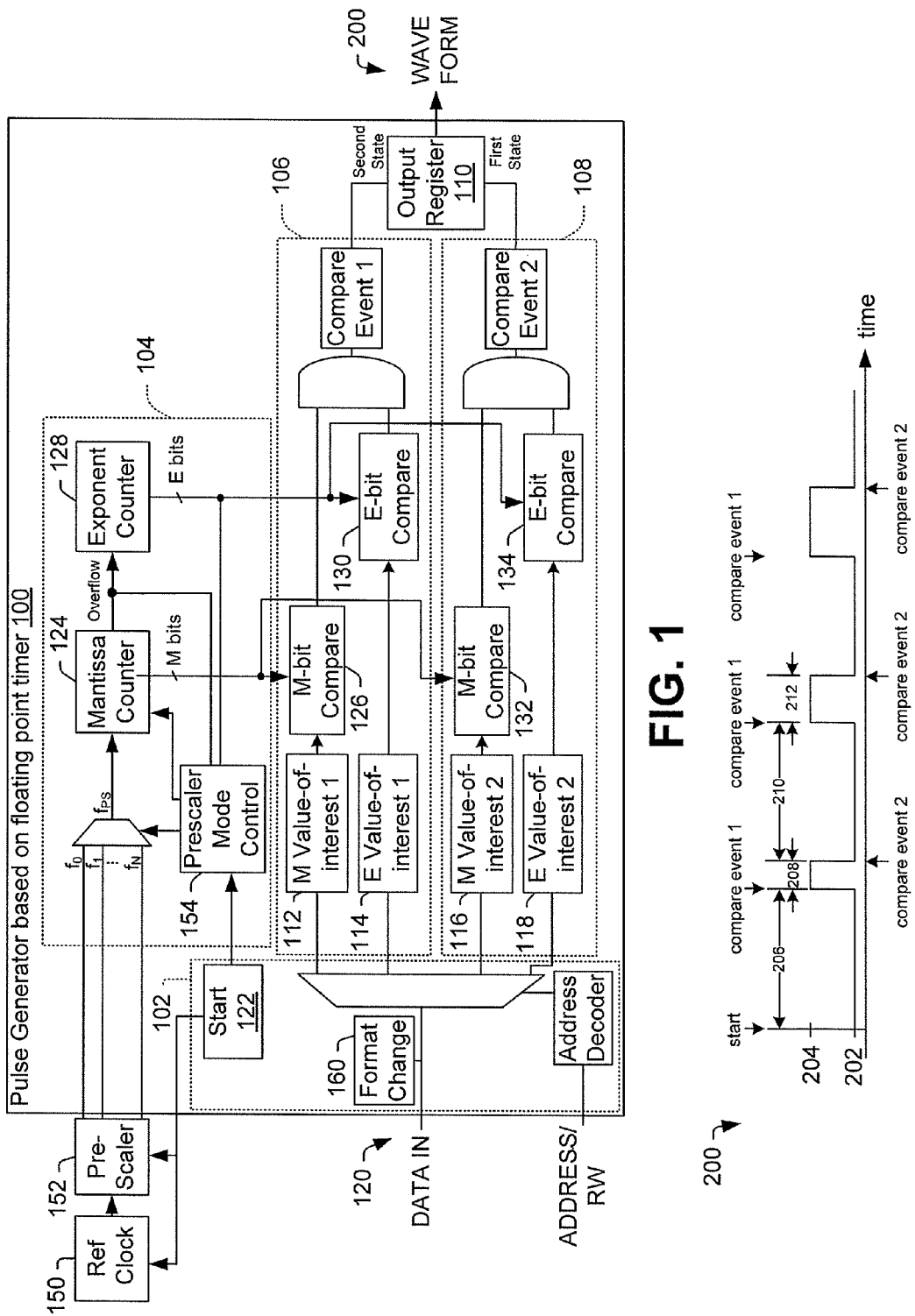
FIG. 1 is a block diagram illustrating a pulse generator that includes a floating point counter in accordance with some embodiments.
FIG. 2 is a waveform that can be output from the pulse generator of FIG. 1.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Aspects of the present disclosure relate to floating point timers and counters that are used in a variety of contexts. In some implementations (see e.g., FIGS. 1-3 and corresponding text), a floating point counter can be used to generate a wave form made up of a series of pulses with different pulse lengths. An array of these floating point counters can be used to implement a pool of delays such as used in a queued serial peripheral interface (QSPI), for example. In other implementations (see e.g., FIGS. 4-9 and corresponding text), an array of floating point counters can be used to analyze waveforms on a number of different communication channels. Analysis of such waveforms may be useful in automotive applications, such as in wheel speed measurement for example, as well as other applications.

FIG. 1 shows a pulse generator 100 having an output configured to deliver a waveform 200 having durations which programmably vary between a first state and a second state, such as shown in FIG. 2, for example. The waveform illustrated in FIG. 2 is in a first state 202 for a first (relatively long) pulse duration 206, and then enters a second state 204 for a second (relatively short) pulse duration 208; the waveform 200 then returns to the first state 202 for a third pulse duration 210 before returning to the second state 204 for a fourth pulse duration 212; and so on. FIG. 2's waveform is merely one example of a waveform shape, and it will be appreciated that other waveforms within the scope of this disclosure can exhibit different pulse durations in the first and second states.

To generate waveforms with programmable pulse durations, FIG. 1's pulse generator 100 includes control circuitry 102, a floating point timer 104, and first and second comparison units (106, 108, respectively) which are coupled to an output register 110. Programmable registers 112-118 within the first and second comparison units can be programmed via an input interface 120 that includes a data bus, an address bus, and a read/write (RW) bit.

To generate a waveform having a desired shape, the input interface 120 is used to program mantissa values-of-interest into the registers 112, 116. The input interface 120 is also used to program exponent values-of-interest into registers 114, 118. The first mantissa value in register 112 and first exponent value in register 114 collectively specify a first time at which a first compare event is to occur (e.g., at end of duration 206 in FIG. 2), as measured from a time at which the floating point counter 104 is started. The second mantissa value in register 116 and second exponent value in register 118 collectively specify a second time at which a second compare event is to occur (e.g., at end of duration 208 in FIG. 2).

After these values-of-interest are programmed into the registers 112-118, respectively, the floating point counter 104 is started (e.g., by writing to a start register 122), after which the counter 104 counts in a floating point fashion as described in more detail below. When the mantissa counter 124 reaches the first mantissa value-of-interest stored in register 112, a first m-bit compare unit 126 asserts a signal. Similarly, when the exponent counter 128 reaches the first exponent value-of-interest stored in register 114, a first e-bit compare unit 130 asserts a signal. Thus, when both compare signals are concurrently asserted, the output register 110 and output waveform are driven to a second data state (e.g., during duration 208 in FIG. 2).

At some later time, the mantissa counter 124 reaches the second mantissa value-of-interest stored in register 116, and the exponent counter 128 eventually reaches the second exponent value-of-interest stored in register 118. At this time, a second m-bit compare unit 132 and a second e-bit compare unit 134 assert signals, thereby driving the output register 110 and waveform pulse to a first data state (e.g., during duration 210 in FIG. 2).

Depending on the implementation, the times programmed into the registers 112-118 can take various forms. For example, consider a scenario where a user desires to signal two different times with reference to a single start time (e.g., the user wants to signal a first event has occurred at 10 ms after a starting time and a second event has occurred 20 ms after the starting time.) In such an example, the user can program the first comparison registers 112, 114 to correspond to 10 ms after the start time, and can program the second comparison registers 116, 118 to correspond to 20 ms after the start time. Thus, once the floating point timer is started, the mantissa counter and exponent counter run freely without being cleared until after both the first and second times have elapsed and corresponding event signals have been generated. Another example could be if there was a first event 10 μs after a start time, and a second event 20 ms after the start time. If we assume a reference clock of 10 MHz, a binary counter would require a 7 bit compare value to signal the first event, and 18 bits to signal the second event. With the floating point timer as set forth in FIG. 2, however, 12 total bits (e.g., 8 bit mantissa and 4 bit exponent) would be sufficient to signal the first and second events. Thus, in this example, the floating point counter module can reduce the number of bits from 18 bits (binary counter) to 12 bits (floating point counter).

In another implementation, the user can program the first comparison registers 112, 114 with a first time corresponding to 10 ms after a starting time, and can program the second comparison registers 116, 118 with a second time corresponding to 10 ms after the end of the first time. Thus, in this example, the mantissa counter and exponent counter can be cleared at the end of the first time, and will then begin counting from a starting value again until the second time is reached.

In any case, by programming successive values into the registers 112-18, the durations of the first and second data states in the waveform can be driven to practically any desired shape over the course of the waveform. Notably, the use of a floating point counter 104 allows for extremely long times between first and second data states while using a limited number of bits in the registers. By contrast, if a fixed point counter were to be used in the same architecture, a significantly larger number of bits would be required for the registers, thereby tending to increase the number of gates in the design and also potentially increasing the power consumed.

To count in floating point fashion, the floating point timer 104 in FIG. 1 includes a reference clock module 150, a pre-scaler 152, and a prescaler mode control module 154 (as well as the mantissa and exponent counters 124, 128). The pre-scaler 152 receives a reference clock signal having a fixed frequency from the reference clock module 150. The pre-scaler 152 then reduces the frequency of the reference clock signal by various amounts, thereby providing a number of different frequencies ($f_0, f_1, \ldots, f_N$). The prescaler mode control 154 then selects one of these frequencies and provides it to the mantissa counter 124.

Initially, the mantissa counter 124 is incremented by a first increment (e.g., 1) that corresponds to the first selected frequency (e.g., frequency, $f_0$). At some point the mantissa counter 124 overflows, and the pre-scalar mode control 154 correspondingly reduces the frequency supplied to the mantissa counter 124 (e.g., by one-half to frequency, $f_1$). At this time, the pre-scalar mode control 154 also sets the mantissa counter 124 to a suitable mantissa count value (e.g., one-half of the maximum mantissa count value). The exponent counter 128 is also incremented when the overflow occurs. Counting can then resume until the mantissa counter overflows again or until the counter is otherwise reset. See also e.g., working examples of FIG. 7-FIG. 8 (illustrating examples of how a floating point counter can operate).

FIG. 1 also shows an optional format change block 160 (e.g., a hardware module included in the pulse generator 100). Because many small CPUs have hardware modules that only process numbers in binary format, if the format change block 160 is not included, software running on a small CPU has to change the representation between binary format of the computation and the floating point format of the timers. This software computation increases the demand for computing power and execution time. Further, even if a CPU supports floating point format, the number of mantissa and exponent bits in the CPU are not necessarily the same as in the floating point timers. Also there, a format change could be necessary. The format change block allows the pulse generator 100 to easily interface with a CPU in the native number format used by a CPU. Thus, in FIG. 1's example, the format change block 160 can receive a binary number from the CPU and use it to determine corresponding floating point numbers, which can, for example, be loaded into the mantissa value of interest registers and the exponent values of interest registers.

Figure 3:
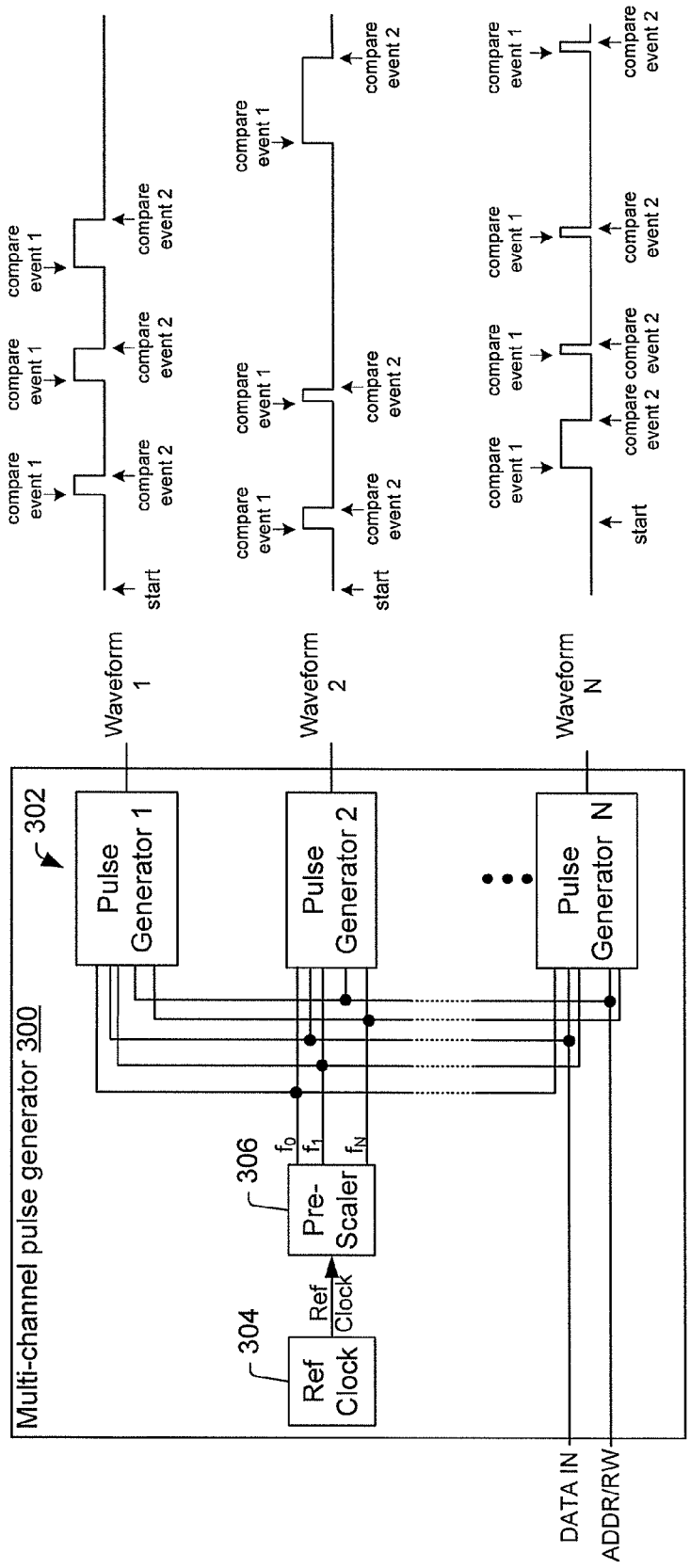
FIG. 3 is a diagram illustrating a multi-channel pulse generator that generates a variety of waveforms in accordance with some embodiments.

FIG. 3 shows an implementation of a multi-channel pulse generator 300 that includes an array of pulse generators 302 associated with different respective channels. Each pulse generator in the array can include a separate instantiation of a pulse generator (e.g., pulse generator 100 as illustrated in FIG. 1). Therefore, the multi-channel pulse generator 300 can concurrently generate a number of different waveforms on the number of channels, respectively, wherein each waveform is independent of the other waveforms. In the illustrated implementation, the individual pulse generators may share a single reference clock module 304 and a single pre-scaler 406, which then provides its number of frequencies to all of the individual pulse generators. In other embodiments, the individual pulse generators 302 can have separate clock modules and pre-scalars, although this tends to use more logical gates than the illustrated implementation. Although not shown in FIG. 3, FIG. 3 could also include a single format change block shared between the pulse generators 302, or could include respective format change blocks for respective pulse generators.

Figure 4:
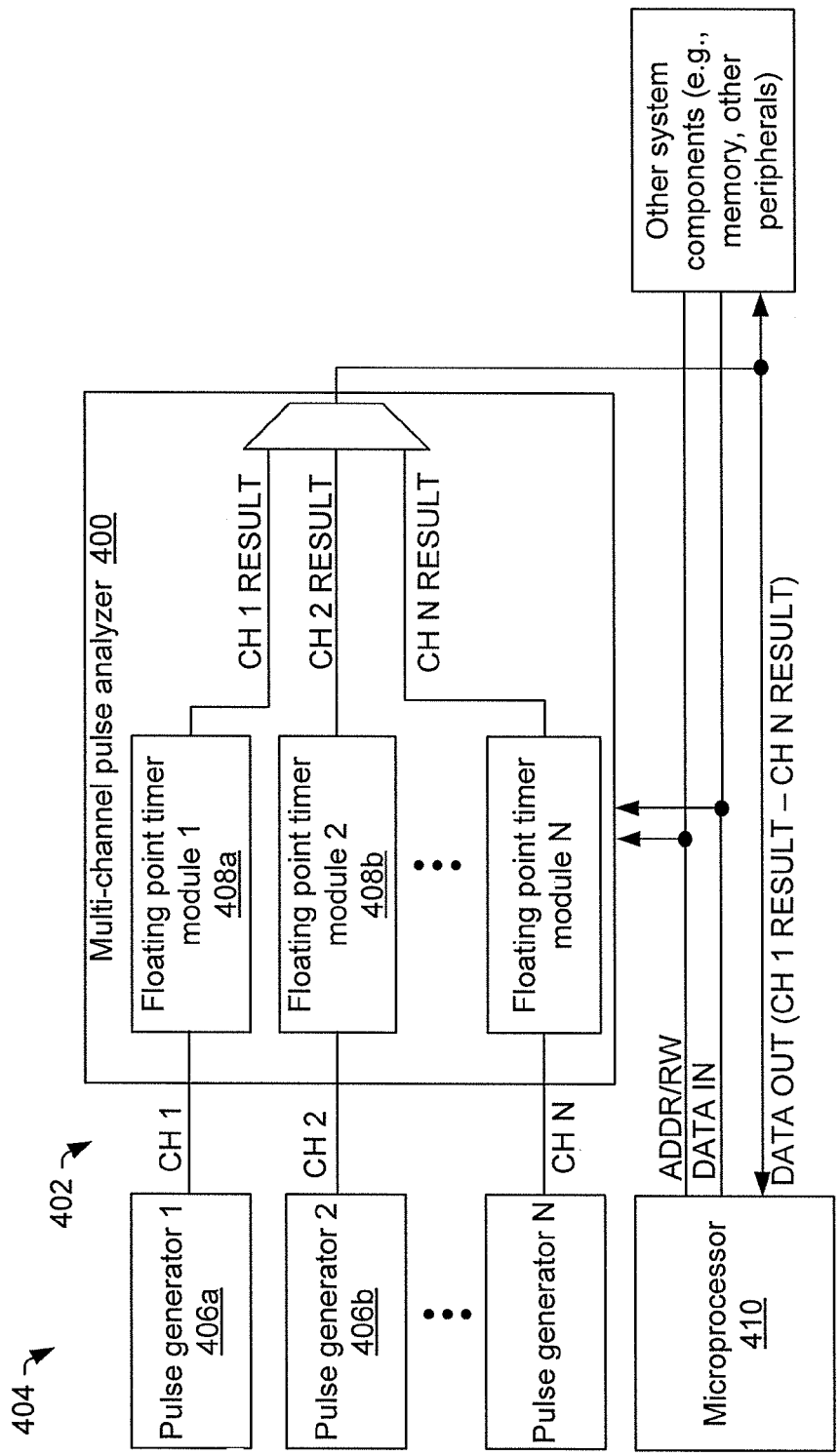
FIG. 4 is a block diagram illustrating a multi-channel pulse analyzer that analyzes waveforms on a number of channels in accordance with some embodiments.

Turning now to FIG. 4, one can see an embodiment that relates to a multi-channel analyzer 400, which is capable of concurrently analyzing a number of different waveforms on a number of different channels 402 (CH 1, CH 2, . . . , CH N), respectively. This embodiment may be useful for example, in an automotive system where the channels 402 are associated with respective pulse generators 404, each of which comprises a separate automotive sensor. For example, a first pulse generator 406a could comprise a right rear-wheel speed sensor, and a second pulse generator 406b could comprise a left rear-wheel speed sensor. The waveform from each sensor can vary between first and second data states in a manner that corresponds to the speed of the respective wheel. Thus, to keep track of the speeds of the left-rear and right-rear wheels, floating point timer modules 408a and 408b monitor the waveforms on the channels 402, and determine results (CH 1 result and CH2 result, respectively) based on the waveforms. These results are then reported to a microprocessor 410, for example by the microprocessor or another module reading registers (or other memory) in the multi-channel analyzer 400 in which the results are stored.

Figure 5:
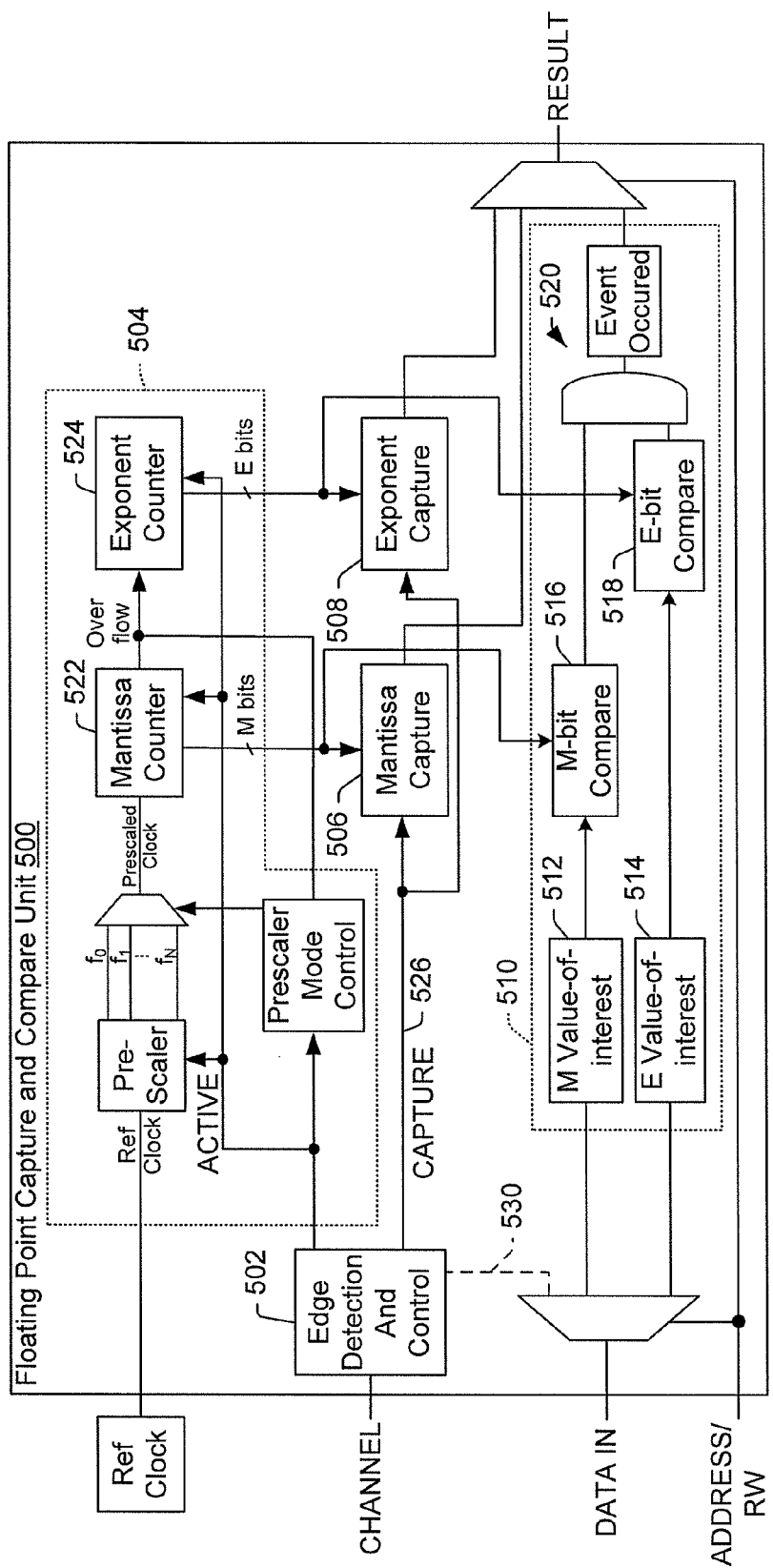
FIG. 5 is block diagram of a floating point capture and compare unit in accordance with some embodiments.

FIG. 5 shows an example of a floating point capture and compare unit 500, which can be used to implement a floating point timer module of FIG. 4 (e.g., floating point timer module 408a and/or 408b). The floating point capture and compare unit 500 includes an edge detection and control module 502, and a floating point counter 504. To enable capture functionality, the unit includes a mantissa capture register 506 and an exponent capture register 508. To enable compare functionality, the unit includes a compare module 510 that includes a programmable mantissa value-of-interest register 512, and a programmable exponent value-of-interest register 514. The compare module 510 also includes an m-bit compare module 516 and an e-bit compare module 518, and logic 520 to determine when an event occurred.

Depending on the mode in which the capture and compare unit is operating, it can either capture mantissa and exponent values at a time of interest (so-called "capture mode"), or can assert an output signal when the floating point counter reaches mantissa and exponent values of interest (so-called "compare mode"). These two modes of operation are described in more detail below.

In capture mode, the floating point counter 504 is counting in a floating point fashion by incrementing the mantissa counter 522 and exponent counter 524. Upon assertion of a capture signal on 526, the registers 506, 508 store the mantissa and exponent values currently in the floating point counter 504. A microprocessor can then subsequently read the mantissa and exponent values by addressing these registers 506, 508. Often, the floating point counter is cleared when the capture event occurs, thereby preparing the floating point counter to begin counting towards another event.

In capture mode, the capture signal on 526 can be asserted in one of at least two ways, depending on the implementation. In one implementation, the capture signal can be asserted based on whether a desired change of state occurs in the waveform (e.g., whether a low-to-high transition occurs). Alternatively, as shown by line 530, the microprocessor or another system module can write an instruction to the capture and compare unit via the input interface, wherein the instruction causes the capture and compare unit to store the mantissa and exponent values in registers 506, 508 at approximately the time the instruction is received.

In compare mode, by contrast, mantissa and exponent values of interest are written to registers 512, 514, respectively. As the floating point counter 504 increments, eventually the count value in its mantissa counter 522 and exponent counter 524 reach the values of interest in the registers 512, 514, and the comparators 516, 518 and logic 520 signal that an event has occurred. In some instances, the capture and compare unit 500 can flag an interrupt when the event occurs, and in other implementations it can set a bit in a status register (not shown) to indicate occurrence of the event. Often, the floating point counter is cleared when this event occurs, thereby preparing the floating point counter to begin counting towards another event.

Figure 6:
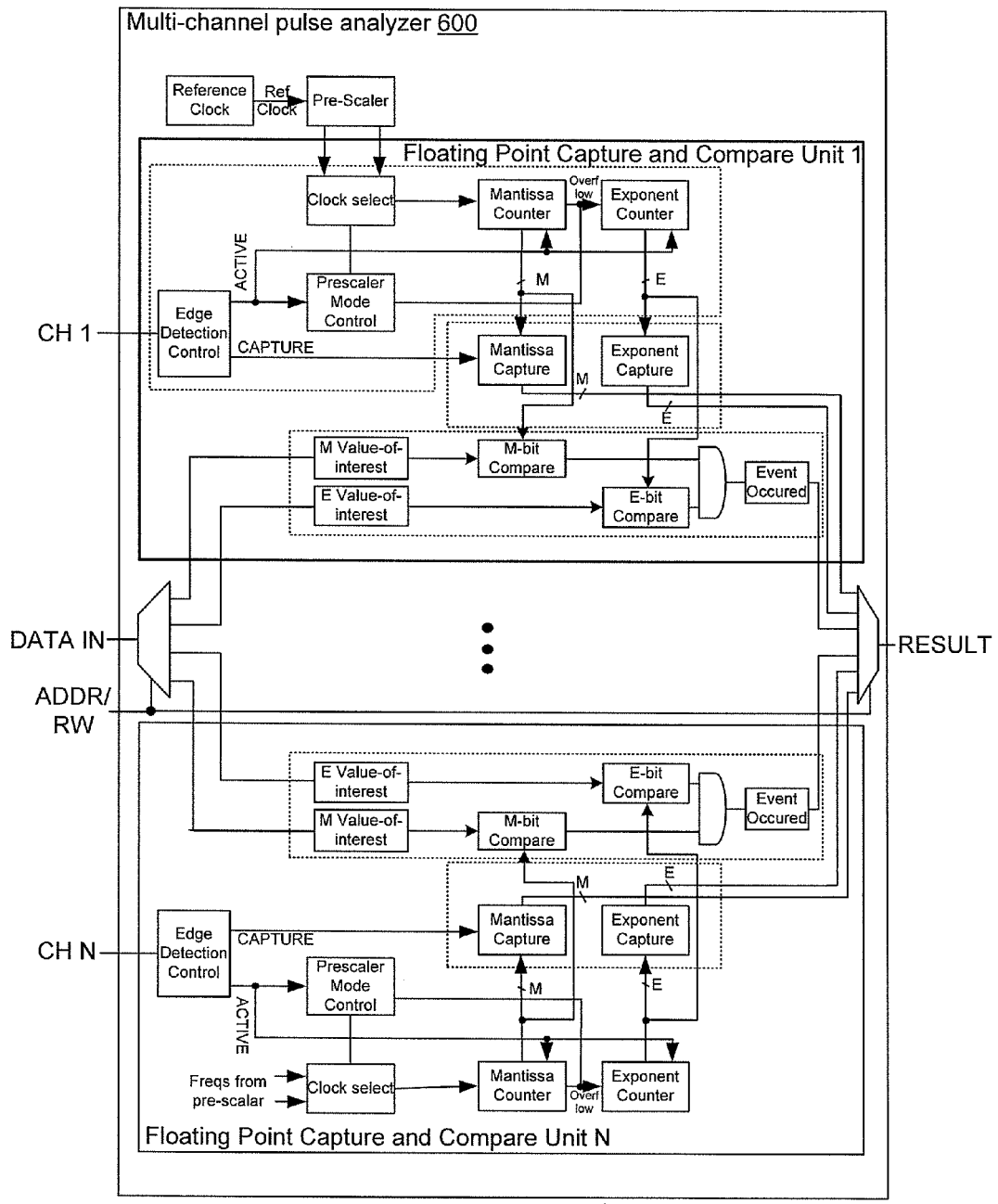
FIG. 6 is a block diagram illustrating another multi-channel pulse analyzer that analyzes waveforms on a number of channels in accordance with some embodiments.

FIG. 6 shows an example where an array of floating point capture and compare units (Floating Point Capture and Compare Unit 1, . . . , Floating Point Capture and Compare Unit N) are arranged to implement a multi-channel pulse generator/analyzer 600. In this example, the floating point capture and compare units can monitor different channels, and then each unit can report a result based on the waveform on its channel. In this example, the floating point capture and compare units share a common reference clock and pre-scalar, although in other embodiments each floating point capture and compare unit can include a separate reference clock and/or pre-scalar module.

FIGS. 4-6, could also include a format change block (e.g., format change block 160 of FIG. 1) that changes the format of the result from floating point to binary. As with previously discussed implementations, such a format change block can facilitate streamlined communication and processing with regards to the system as a whole.

Working Examples

Figure 7:
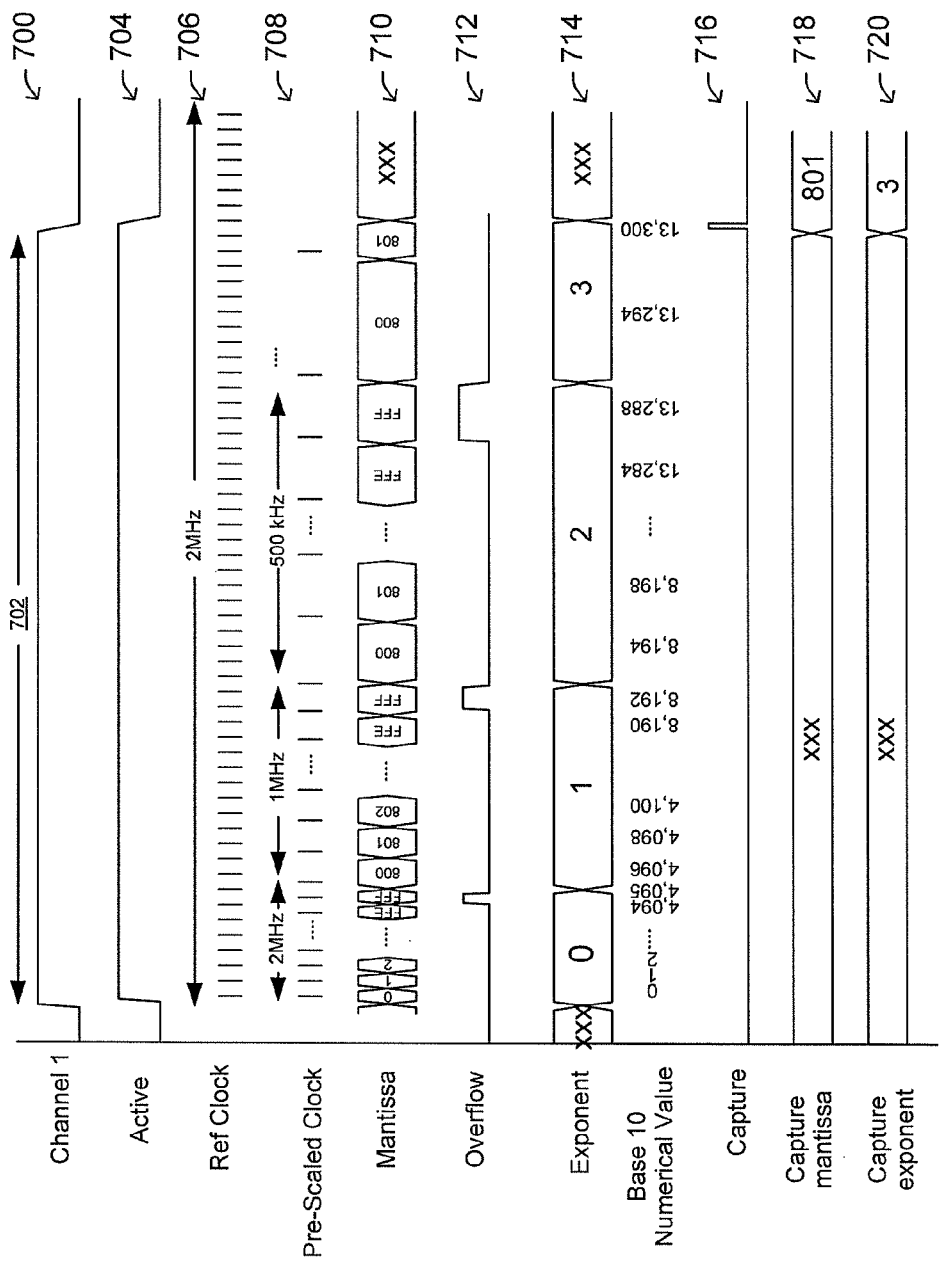
FIG. 7 is an example timing diagram illustrating operation of a floating point capture and compare unit in capture mode according to one embodiment.

FIG. 7 shows a working example of operation of a capture and compare unit in capture mode, which has been drafted to be consistent with FIG. 5. In FIG. 7's example, the capture and compare module is configured to measure a pulse duration 702 of a waveform 700 received on channel 1 while the waveform 700 is in a high-state. Durations of low-states or combinations of low-states and high-states could also be measured.

As can be seen, when the waveform 700 enters the high-state, an active signal 704 (e.g., provided by an edge detection and control module 502 in FIG. 5) is asserted, thereby activating distribution of a reference clock signal 706 to the capture and compare unit (e.g., by enabling a clock gating cell). A pre-scaled clock 708, which initially has a first frequency based on the reference clock, is provided to the mantissa counter 710. The mantissa counter then increments at an increment value (e.g., x001) at each pulse of the pre-scaled clock.

When the mantissa counter overflows as shown by 712, the exponent counter 714 increments. Also at this time, the mantissa count value is set to 0x800, the clock frequency is to one-half of its initial frequency, and the mantissa counter continues incrementing at the increment value (e.g., x001) at each pulse of the prescaled clock.

Eventually, when the pulse on channel 1 drops from the high-state to the low-state (the condition to be detected in this example), a capture signal 716 goes high, which causes the mantissa and exponent values at that time to be stored in registers as shown by 718 and 720 (e.g., registers 506, 508 in FIG. 5). A microprocessor or other system component can then retrieve these stored values by reading from addresses associated with the registers.

Figure 8:
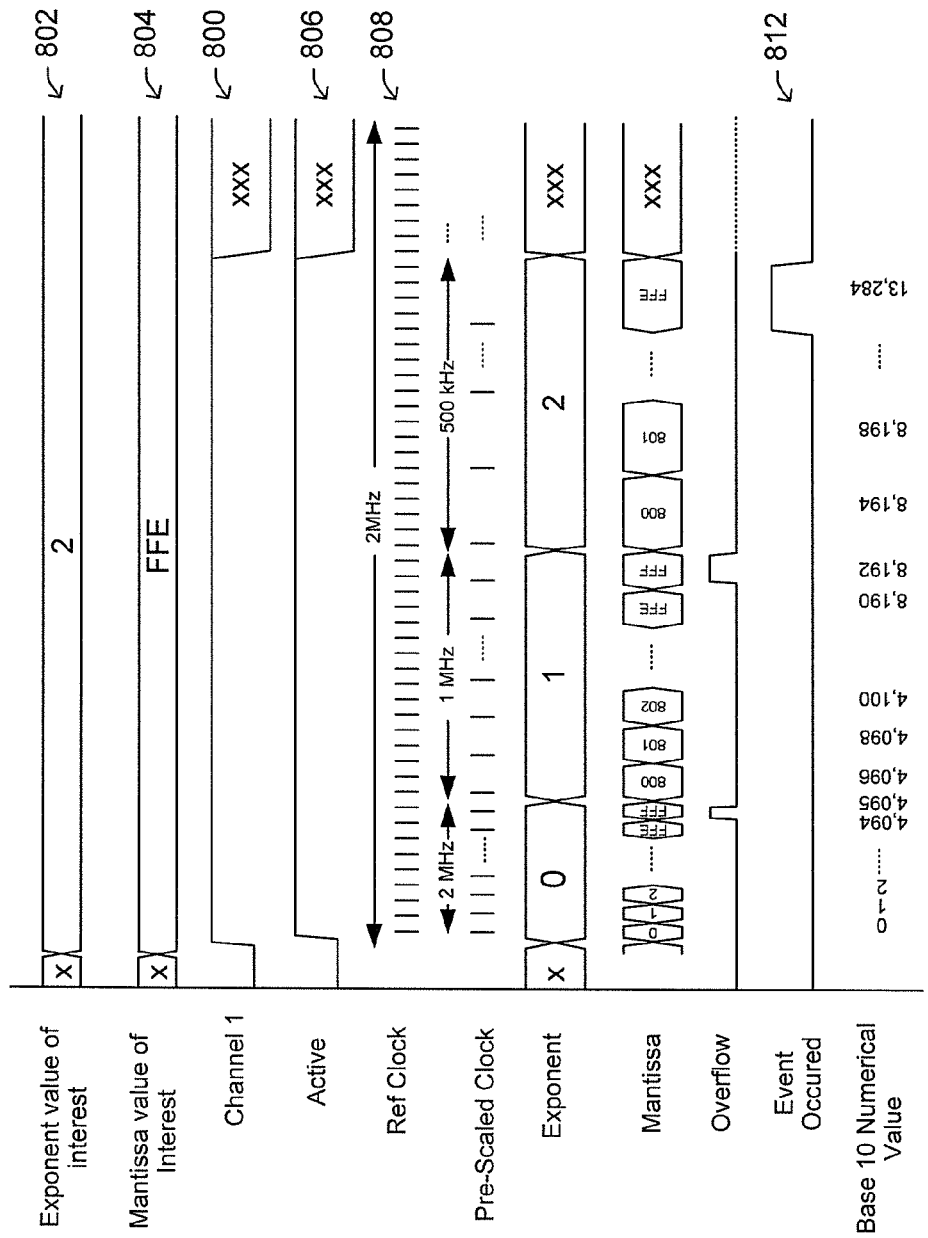
FIG. 8 is an example timing diagram illustrating operation of a floating point capture and compare unit in compare mode according to one embodiment.

FIG. 8 shows a working example of operation of the capture and compare unit in compare mode. In this example, before or while a waveform 800 on the channel goes high, a mantissa value of interest 802 (xFFE) and an exponent value of interest 804 (x002) are set (e.g., by being programmed into registers 512, 514, respectively, in FIG. 5).

When the waveform 800 enters the high-state, an active signal 806 (e.g., provided by an edge detection and control module 502 in FIG. 5) activates the distribution of a reference clock signal 808, and the mantissa and exponent portions of the floating point counter count as previously discussed with reference to FIG. 7. However, when the exponent value reaches x002 and when the mantissa value reaches xFFE, the current value of the floating point timer equals the exponent and mantissa values of interest 802, 804. Because of this, the event occurred signal 810 is asserted. This can notify the system that the event (a time corresponding to an exponent value of x002 and a mantissa value of xFFE) has occurred.

It will be appreciated that although waveforms of FIGS. 7-8 illustrate the frequency of the prescaled clock being "stepped" by ½ between each successive overflow, other step values are also contemplated as falling within the scope of this disclosure. For instance, although FIG. 7 shows the pre-scaled clock starting at 2 MHz and then decreasing to 1 MHz, and then 500 KHz, in other embodiments the prescaled clock could also start at 2 MHz and then decrease to 500 kHz, and then decrease to 125 kHz (i.e., be "stepped down" by a factor of 4). In general, the frequency could be stepped by N, wherein N is any integer value. By providing values of N other than simply N=2, these other embodiments can provide a greater range of tradeoffs between precision and circuit area than has been previously achievable. In some embodiments, the value of N can be programmable, although this may require a significant number of additional gates to achieve this functionality. The mantissa counter is set to (maximum of mantissa counter+1)/N.

Figure 9:
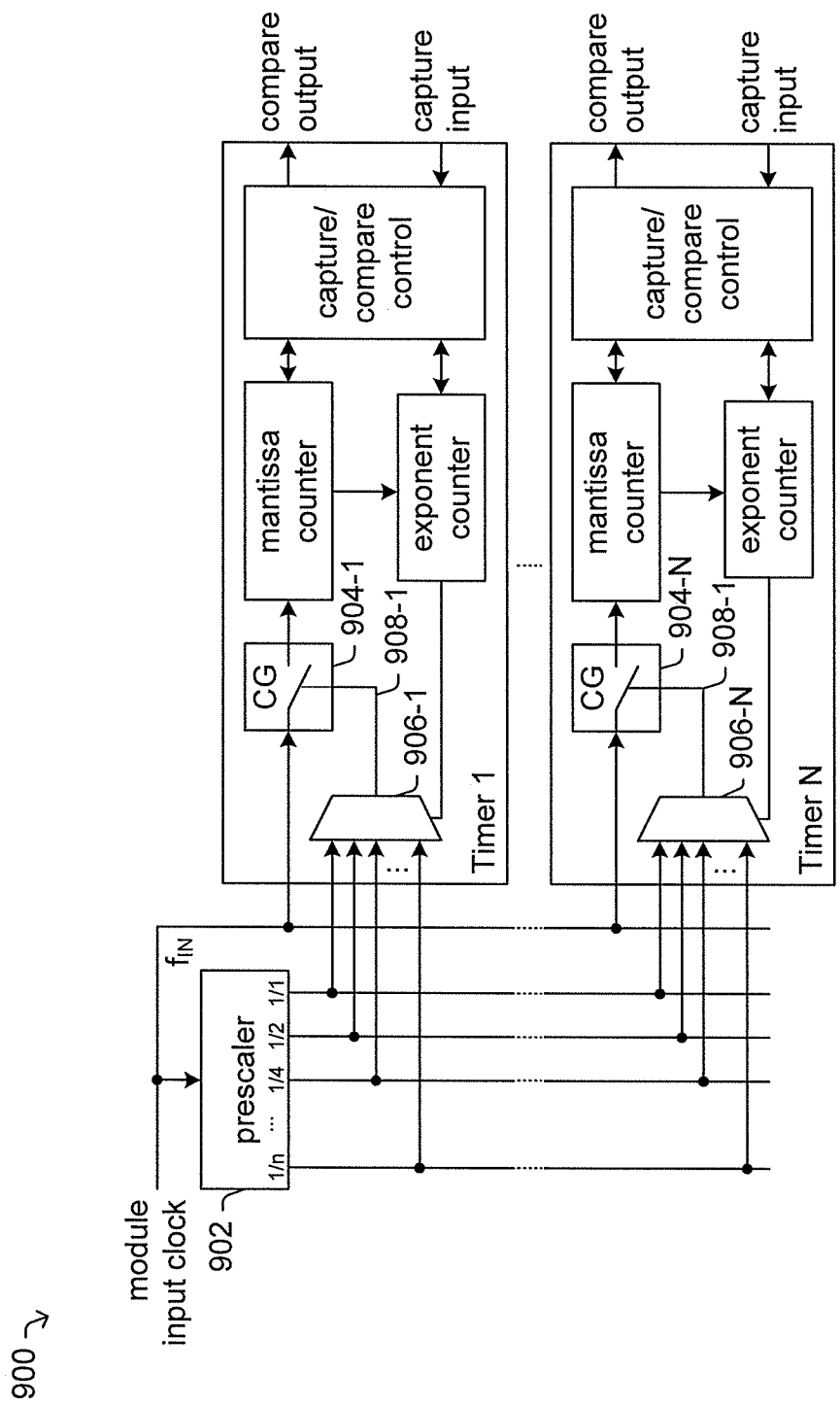
FIG. 9 is a block diagram illustrating an example of a floating point timer module that includes a clock gating module.

FIG. 9 shows an example of a peripheral 900 that includes an array of floating point timers (Timer 1, . . . Timer N), wherein each floating point timer receives a number of different clock enable signals having different frequencies (e.g., $1/1*f_{IN}, 1/2*f_{IN}, 1/4*f_{IN}, \ldots, 1/n*f_{IN}$) from a single prescaler 902. To limit clock skew between the floating point timers, each floating point timer module includes a clock gating module (904-1, . . . , 904-N). Based on a control signal provided from an exponent counter, respective frequency selection elements (906-1, . . . , 906-N) select a clock enable signal-of-interest on lines (908-1, . . . 908-N) from the plurality of clock enable signals. The clock gating modules (904-1, . . . , 904-N) provide a gated clock to a respective mantissa counter based on the module input clock and the clock enable signal-of-interest.

During operation, the module input clock varies between first and second states (e.g., 3.3 V and 0V) at the input first frequency, $f_{IN}$. The prescaler 902 than reduces the input frequency by various amounts to provide a series of scaled frequencies (e.g., $1/1*f_{IN}, 1/2*f_{IN}, 1/4*f_{IN}, \ldots 1/n*f_{IN}$). These scaled frequencies are then delivered to each module by a bus 906. At any given time within a floating point timer, the exponent counter value will select a single scaled frequency to be provided to the control gate of the clock gating module. For example, soon after the floating point counter begins counting, the $1/2*f_{IN}$ frequency can be selected. At this time even though $f_{IN}$ is present on a source of control gate, the fact that a signal with $1/2*f_{IN}$ is asserted on the control gate of clock gating module will block some pulses of the input clock. Consequently, the mantissa counter counts according to $1/2*f_{IN}$ during this time, but is based on the module input clock. In addition to limiting clock skew between the floating point timers, this configuration can also limit power consumption because the floating point timer is only clocked when necessary. As a consequence, the power consumption of a timer automatically scales down with the frequency, independently for each timer.

Although FIGS. 1-3 showed a pulse generator 100 and FIGS. 4-6 showed a pulse analyzer, it will be appreciated that some implementations may include a combination of pulse generators and pulse analyzers in a single peripheral (e.g., on a single integrated circuit). Floating point counters within such pulse generators and/or pulse analyzers can count independently, such that they count at the same or different frequencies at any given time. Thus, the embodiments shown in the figures can be combined with one another in various manners, all of which are contemplated as falling within the scope of this disclosure.

Although the disclosure has been shown and described with respect to one or more implementations, equivalent alterations and modifications will occur to others skilled in the art based upon a reading and understanding of this specification and the annexed drawings. For example, although some implementation were described above with respect to a capture and compare module, other un-illustrated implementations can include only capture functionality (not compare functionality) or can include only compare functionality (not capture functionality). Other permutations and combinations of the above-disclosed concepts are also contemplated as falling within the scope of the disclosure. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A method, comprising:
   receiving a plurality of wave forms on a plurality of channels, respectively, in a digital communication device;
   incrementing a floating point timer value so long as the wave form on a corresponding channel is in a first state; and
   determining a channel result based on the floating point timer value.

2. The method of claim 1, further comprising:
   storing the floating point timer value at an end of the wave form; and
   determining the channel result to correspond to a duration of the wave form.

3. The method of claim 1, further comprising:
   selectively storing the result based on whether a duration of the first state has a predetermined relationship to a duration of interest.

4. A method, comprising:
   in a processor or other digital integrated circuit, incrementing a mantissa count value and an exponent count value of a floating point timer based on a reference clock signal;
   generating a first comparison result indicating whether the mantissa count value and the exponent count value have predetermined relationships with a first mantissa value-of-interest and a first exponent value-of-interest, respectively;
   generating a second comparison result indicating whether the mantissa count value and the exponent count value have predetermined relationships with a second mantissa value-of-interest and a second exponent value-of-interest, respectively; and
   providing a waveform based on the first and second comparison results.

5. The method of claim 4 further comprising:
   selectively adjusting the exponent count value based on whether or not a predetermined relationship exists between the exponent count value and at least one of: the first exponent-value-of-interest or the second exponent value of interest.

6. The method of claim 4 further comprising:
selectively adjusting the mantissa count value based on whether or not a predetermined relationship exists between the mantissa count value and at least one of: the first mantissa-value-of-interest or the second mantissa value of interest.

7. A floating point timer module, comprising:
a clock module to provide a module input clock;
a prescaler to provide a plurality of clock enable signals having different respective frequencies based on the module input clock;
a frequency selection element to, based on a control signal provided from an exponent counter, select a clock enable signal-of-interest from the plurality of clock enable signals; and
a clock gating module to provide a gated clock to a mantissa counter based on the module input clock and the clock enable signal-of-interest.

8. The floating point timer module of claim 7, further comprising:
a format change block to change from a floating point data format to a binary data format, or vice versa.

9. A floating point timer, comprising:
a reference clock module configured to provide a fixed reference frequency;
a prescaler configured to generate a number of different frequencies based on the fixed reference frequency, wherein a pair of neighboring frequencies within the number of different frequencies are spaced at other than a factor of two multiple of one another;
a mantissa counter configured to initially increment according to a first of the pair of neighboring frequencies and subsequently increment according to a second of the pair of neighboring frequencies before an overflow signal is activated in the mantissa counter; and
an exponent counter configured to increment upon activation of the overflow signal.

10. The floating point timer of claim 9, wherein the frequency spacing of the pair of neighboring frequencies is programmable.

* * * * *